US006813178B2

(12) United States Patent
Campbell et al.

(10) Patent No.: US 6,813,178 B2
(45) Date of Patent: Nov. 2, 2004

(54) CHALCOGENIDE GLASS CONSTANT CURRENT DEVICE, AND ITS METHOD OF FABRICATION AND OPERATION

(75) Inventors: Kristy A. Campbell, Boise, ID (US); Terry L. Gilton, Boise, ID (US); John T. Moore, Boise, ID (US); Joseph F. Brooks, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/386,028

(22) Filed: Mar. 12, 2003

(65) Prior Publication Data

US 2004/0179390 A1 Sep. 16, 2004

(51) Int. Cl.[7] .............................................. G11C 11/00
(52) U.S. Cl. ........................ 365/148; 365/113; 365/45
(58) Field of Search .............................. 365/148, 113, 365/45

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |

(List continued on next page.)

FOREIGN PATENT DOCUMENTS

| | | |
|---|---|---|
| JP | 56126916 | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Yoji Kawamoto, et al., "Ionic Conduction in $As_2-S_3-Ag_2S$, and $P_2S_5-Ag_2S$ Glasses," Journal of Non–Crystalline Solids 20, pp. 393–404 (1976).

(List continued on next page.)

*Primary Examiner*—Huan Hoang
(74) *Attorney, Agent, or Firm*—Dickstein Shapiro Morin & Oshinsky LLP

(57) ABSTRACT

The invention is related to methods and apparatus for providing a two-terminal constant current device, and its operation thereof. The invention provides a constant current device that maintains a constant current over an applied voltage range of at least approximately 700 mV. The invention also provides a method of changing and resetting the constant current value in a constant current device by either applying a positive potential to decrease the constant current value, or by applying a voltage more negative than the existing constant current's voltage upper limit, thereby resetting or increasing its constant current level to its original fabricated value. The invention further provides a method of forming and converting a memory device into a constant current device. The invention also provides a method for using a constant current device as an analog memory device.

85 Claims, 9 Drawing Sheets

U.S. PATENT DOCUMENTS

| | | |
|---|---|---|
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,363,329 A * | 11/1994 | Troyan |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowery |
| 6,673,700 B2 | 1/2004 | Dennison et al. |
| 6,674,115 B2 | 1/2004 | Hudgens et al. |
| 6,687,153 B2 * | 2/2004 | Lowrey .................... 365/148 |
| 6,687,427 B2 | 2/2004 | Ramalingam et al. |
| 6,690,026 B2 | 2/2004 | Peterson |
| 6,696,355 B2 | 2/2004 | Dennison |

| | | |
|---|---|---|
| 6,707,712 B2 | 3/2004 | Lowery |
| 6,714,954 B2 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0163828 A1 | 11/2002 | Krieger et al. |
| 2002/0168820 A1 | 11/2002 | Kozicki |
| 2002/0190350 A1 | 12/2002 | Kozicki |
| 2003/0001229 A1 | 1/2003 | Moore et al. |
| 2003/0027416 A1 | 2/2003 | Moore |
| 2003/0035314 A1 | 2/2003 | Kozicki |
| 2003/0035315 A1 | 2/2003 | Kozicki |
| 2003/0048744 A1 | 3/2003 | Ovshinsky et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25-xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor $Ge_xSe_{1-x}$, Egypt J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 n(1973) K169–K171.

Angell, C.A., Mobile Ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahare, Y.; Izumitani, T., Voltage controlled switching in Cu—As—Se compositions, J. Non–Cryst. Solids 11 (1972) 97–104.

Asokan, S.; Prasad, M.V.N.; Parthasarathy, G.; Gopai, E.S.R., Mechanical and chemical thresholds in IV–VI chalcogenide glasses, Phys. Rev. Lett 62 (1989) 808–810.

Baranovskii, S.D.; Cordes, H., On the conduction mechanism in ionic glasses, J. Chem. Phys. 111 (1999) 7546–7557.

Belin, R.; Taillades, G., Pradel, A.; Ribes, M., Ion dynamics in superionic chalcogenide glasses: complete conductivity spectra, Solid State Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M—Ag2Se—M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kitaff, M.; Conan, A., Transition from S– to N–type differential negative resistance in Al—Al2O3—Ag2-xSe1+ thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temp rature (Tg) near x=1/3 in $Ge_xSe_{1-x}$ Glasses, Asian Journal of Physics (2000) 9, 709–72.

Boolchand, P.; Bresser, W.J., Mobile silver Ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in $Ge_xSe_{1-x}$ glasses, Solid state comm. 45 (1983) 183–185.

Boolchand, P., Bresser, W.J., Compositional trends in glass transition temperature (Tg), network connectivity and nanoscale chemical phase separation in chalcogenides, Dept of ECECS, Univ. Cincinnati (Oct. 28, 1999) 45221–0030.

Boolchand, P.; Grothaus, J. Molecular Structure of Melt–Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P., Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As—Te—Se glasses, J. Phys. D: Appl. Phys. 27 (1994) 2624–2627.

Chen, C.H.; Tai, K.L. , Whisker growth induced by Ag photodoping in glassy GexSe1-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300k, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag—Ge—Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non. Cryst. Solids 198–200 (1996) 829–832.

El Bouchairi, B.; Bernede, J.C.; Burgaud, P., Properties of Ag2-xSe1+/n-Si diodes, Thin Solid Films 110 (1983) 107–113.

El Gharras, Z., Bourahla, A.; Vautier, C., Role of photoinduced defects in amorphous GexSe1-x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in situ" resistance measurements vs time, Phys. Stat. Sol. (a) 123 (1991) 451–460. El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanisms in the pre–switching state of thin films containing Te As Ge Si, Vacuum 46 (1995) 701–707.

El–Zahed, H.; El–Korashy, A., Influence of composition on the electrical and optical properties of Ge20BixSe80-x films, Thin Solid Films 376 (2000) 236–240.

Fadel, M., Switching phenomenon in evaporated Se—Ge—As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X.; Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag—GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Identation creep of Ge—Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C.; Meiscoet, I.; Lucas, J., Hardness, toughness and scratchability of germanium–selenium chalco nid glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the change–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As—Se—Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in meal–a–Si: H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 20–43.

Iizima, S.; Sugi, M.; Kikuchi, M.; Tanaka, K., Electrical and thermal properties of semiconducting glasses As—Te—Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag—Ge—S and Ag—Ge—Se films and comparison of photoinduced and th rmally induced phenomena of both systems, J. Appl. Phys. 79 (1996) 9096–9104.

Kawaguchi, T.; Masui, K., Analysis of change in optical transmission sp ctra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R.; Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTI chalcogenide semiconductor films, Thin Solid Films 240 (1994) 143–146.

Lakshiminarayan, K.N.; Srivastava, K.K; Panwar, O.S.; Dumar, A., Amorphous semiconductor devices: memory switching and mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Pool–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se—SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L., Reversible and irreversible electrical switching in TeO2–V2O5 based glasses, Journal of Physique IV 2 (1992) C2–185–C2–188.

Messoussis, R.; Bernede, J.C.; Benhida, S.; Abachi, T.; Latef, A., Electrical characterization of M/Se structures (M=Ni, Bi) Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge—Se glasses used in programmable metallization of cell devices, J. Non–Cryst. Solids 299–302 (2002) 1023–1027.

Mitkova, M.; Wang, Y.; Boolchand, P., Dual–chemical role of Ag as an additive in chalcogenide glasses, Phys. Rev. Lett. 83 (1999) 3848–3851.

Miyatani, S.–y., Electronic and ionic conduction in (AgxCu1–x)2Se, J. Phys. Soc. Japan 34 (1973) 423–432.

Miyatani, S.–y., Electronic and ionic conduction in (AgxCu1–x)2Se, J. Phys. Soc. Japan 34 (1973) 423–432.

Miyatani, S.–y., Electronic and ionic condition in (AgxCu1–x)2Se, J. Phys. Soc. Japan 34 (1973) 423–432.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojioma, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushsita, T.; Yokota, S.; Suzuki, A., Electrical and optical parameters of G xSe1–x amorphous thin films, Jap. J. App. Phys. 15 (1976) 849–853.

Narayanan, R.A.; Asokan, S.; Kumar, A., Evidence conc rning th affect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, Appl Phys. Lett. 14 (1969) 280–282.

Pinto, R.; Ramanathan, K.V., Electric field induced memory switching in thin films of the chalcogenide system Ge—As—Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977)K71–K73.

Prakash, S.; Asokan, S.; Ghare, D.B., Easily reversible memory switching in Ge—As—Te glasses, J. Phys. D: Appl. Phys. 29 (1996) 2004–2008.

Rahman, S.; Sivarama Sastry, G., Electronic switching in Ge—Bi—Se—Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag,, Appl. Phys. A 69 (1999) 421–425.

Rose,M.J.; Hajto, J.;Lecomber,P.G.;Gage,S.M.;Choi,W.K.; Snell,A.J.;Owen,A.E., Amorphous silicon analogue memory devices, J. Non–Cryst. Solids 115 (1989) 168–170.

Rose, M.J.;Snell,A.J.;Lecomber,P.G.;Hajto,J.;Fitzgerald, A.G.;Owen,A.E., Aspects on non–volatility in a–Si:H memory devices, Mat. Res. Soc. Symp. Proc. V 258, 1992, 1075–1980.

Schuocker, D.; Rieder, G., On the reliability of amorphous chalcogenide switching devices, J. Non–Cryst. Solids 29 (1978) 397–407.

Sharma, A.L.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. of pure and applied phys. 35 (1997) 424–427.

Snell, A.J.; Lecomber, P.G.; Hajto, J.; Rose, M.J.; Owen, A.E.; Osborne, I.L., Analogue memory effects in metal/ a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon,A.G., Microfilaments in amorphous chalcogenide memory devices, J. Phys. D.: Appl. Phys. 8 (1975)L120–L122.

St v nton, A.G., The switching mechanisms in amorphous chalcogenide memory devices, J. Non–Cryst. Solids 21 (1976) 319–329.

Stocker, H.J., Bulk and thin film switching and m mory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D. D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As—Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag—Ge—Se Ionic conduction and exafs structural investigation, Transport–structure relations in fast ion and mixed conductors Proceedings of the 6th Riso International symposium, Sep. 9–13, 1985.

Tregouet, Y.; Bernede, J.C., Silver movements in Ag2Te thin films: switching and memory effects, Thin Solid Films 57 (1979) 49–54.

Uemura, O., Kameda, Y.; Kohai, S.; Satow, T., Thermally induced crystallization of amorphous Ge0.4Se0.6, J. Non–Cryst Solids 117–118 (1990) 219–221.

Uttecht, R.; Stevenson, H.; Sie, C.H.; Griener, J.D.; Raghavan, K.S., Electric field induced filament formation in As—Te—Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Parvanov,S.; Petkov,P., Electrode–limited currents in the thin–film M—GeSe—M system, Mat. Chem. And Phys. 21 (1989) 447–454.

Wang, S.-J.; Misium, G.R.; Camp, J.C.; Chen, K.-L.; Tigelaar, H.L., High–performance Metal/silicide antifuse, IEEE electron dev. Lett 13 (1992)471–472.

Weirahcu, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag 0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Axon Technologies Corporation, Technology Description: Programmable Metallization Cell(PMC), pp. 1–6 (Pre–May 2000).

Helbert et al., Intralevel hybrid resist process with submicron capability, SPIE vol. 333 Submicron Lithography, pp. 24–29 (1982).

Hilt, Dissertation: *Materials characterization of Silver Chalcogenide Programmable Metallization Cells,* Arizona State University, pp. Title page–114 (UMI Company, May 1999).

Hiros, et al., High Speed Memory Behavior and Reliability of an Amorphous $As_2S_3$ Film Doped Ag, Phys. Stat. Sol. (a) 61, pp. 87–90 (1980).

Holmquist et al., Reaction and Diffusion in Silver–Arsenic Chalcogenide Glass Systems, 62 J. Amer. Ceram. Soc., No. 3–4, pp. 183–188 (Mar.–Apr. 1979).

Huggett et al., Development of silver sensitized germanium selenide photoresist by reactive sputter etching in $SF_6$, 42 Appl. Phys. Lett., No. .7, pp. 592–594 (Apr. 1983).

Kawaguchi et al., Mechanism of photosurface deposition, 164–165 J. Non–Cryst. Solids, pp. 1231–1234 (1993).

Kolobov and Elliott, Photodoping of Amorphous Chalcogenides by Metals, Advances in Physics, vol. 40, No. 5, 625–684 (1991).

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki, et al., Nanoscale effects in devices based on chalcogenide solid solutions, Superlattices and Microstructures, 27, 485–488 (2000).

Kozicki, et al., Nanoscale phase separation in Ag—Ge—Se glasses, Microelectronic Engineering, vol. 63/1–3, 155–159 (2002).

M.N. Kozicki and M. Mitkova, Silver incorporation in thin films of selenium rich Ge—Se glasses, Proceedings of the XIX International Congress on Glass, Society for Glass Technology, 226–227 (2001).

McHardy et al., The dissolution of metals in amorphous chalcogenides and the effects o electron and ultraviolet radiation, 20 J. Phys. C.: Solid State Phys., pp. 4055–4075 (1987)f.

Owen et al., Metal–Chalcogenide Photoresists for High Resolution Lithography and Sub–Micron Structures, Nanostructure Physics and Fabrication, pp. 447–451 (M. Reed ed. 1989).

Shimizu et al., The Photo–Erasable Memory Switching Effect of Ag Photo–Doped Chalcogenide Glasses, 46 B. Chem. Soc. Japan, No. 12, pp. 3662–3365 (1973).

* cited by examiner

CHALCOGENIDE GLASS CONSTANT CURRENT DEVICE, AND ITS METHOD OF FABRICATION AND OPERATION

FIELD OF THE INVENTION

The present invention relates to a constant current device, and more specifically, to a constant current device formed of chalcogenide materials.

BACKGROUND OF THE INVENTION

Programmable resistive materials based on chalcogenide glass are being explored for use as non-volatile memory elements. By applying an external stimulus, such as different voltages of selected polarities to a chalcogenide glass in the presence of an available metal such as silver, the internal structure of the chalcogenide glass can be modified to produce high or low resistance states.

One specific example of a chalcogenide glass being investigated for memory use is germanium-selenide ($Ge_xSe_{100-x}$). Typically, the chalcogenide glass has an associated layer for supplying a metal, which becomes incorporated with the glass matrix to change resistance states. As examples, the associated layer may be a layer of silver or a layer of silver-selenide ($Ag_2Se$).

While the current focus is on using chalcogenide glass for memory devices, the inventors have discovered another use for chalcogenide glass, namely, as a constant current device.

BRIEF SUMMARY OF THE INVENTION

In one aspect, the invention provides a two-terminal constant current device formed of a chalcogenide glass material, and its method of formation and operation. The device comprises a metal-containing layer formed adjacent at least one chalcogenide glass layer which is biased into a constant current state. The constant current device maintains a constant current over a range of applied voltages.

In another aspect, the invention provides a constant current device and a method of forming and operating such a device in which at least one layer of silver-selenide is formed between a first germanium-selenide layer and a second germanium-selenide layer. These layers are provided between a first and a second electrode. A bias voltage is applied to the electrodes sufficient to place the device in a constant current state. The constant current device maintains a constant current over a range of applied voltages.

In another aspect, the invention provides a constant current device and a method of forming and operating such a device in which at least one layer of silver-selenide is formed between a first germanium-selenide layer, a layer of silver, and a second germanium-selenide layer. These layers are provided between a first and a second electrode. A bias voltage is applied to the electrodes sufficient to place the device in a constant current state. The constant current device maintains a constant current over a range of applied voltages.

In another aspect, the invention provides a constant current device and a method of forming and operating such a device in which at least one metal-containing layer, such as silver, is formed on a chalcogenide glass layer such as a germanium-selenide layer. A bias voltage is applied to the layers sufficient to place the device in a constant current state. The constant current device maintains a constant current over a range of applied voltages.

In another aspect, the invention provides a constant current device and a method of forming and operating such a device in which at least one metal-containing layer, such as silver-selenide, is formed with a chalcogenide glass layer such as a germanium-selenide layer, and a layer of silver. A bias voltage is applied to these layers sufficient to place the device in a constant current state. The constant current device maintains a constant current over a range of applied voltages.

In another aspect, the invention provides a method of converting a device that has been exhibiting memory behavior comprised of at least one chalcogenide glass layer and a metal-containing layer, for example, of silver or silver-selenide to a constant current device. A bias voltage is applied to the layers sufficient to place the device in a constant current state. The constant current device maintains a constant current over a range of applied voltages.

In another aspect, the invention provides a method of altering the current characteristics of a constant current device formed with at least one chalcogenide glass layer by manipulation of an applied bias voltage.

In another aspect, the invention provides a method of resetting or raising the current characteristics of a constant current device formed with at least one chalcogenide glass layer to a prior state by manipulation of an applied bias voltage.

These and other features and advantages of the invention will be better understood from the following detailed description, which is provided in connection with the accompanying drawings.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical, and electrical changes may be made without departing from the spirit or scope of the invention.

The term "substrate" used in the following description may include any supporting structure including but not limited to a glass, plastic, or semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures which may not be silicon-based. When reference is made to a semiconductor substrate in the following description, previous process steps may have been utilized to form regions or junctions in and/or over the base semiconductor or foundation.

The term "silver" is intended to include not only elemental silver, but silver with other trace metals or in various alloyed combinations with other metals as is known in the semiconductor industry, as long as such silver alloy is conductive, and as long as the physical and electrical properties of the silver remain unchanged.

The term "silver-selenide" is intended to include various species of silver-selenide, including some species which may have a slight excess or deficit of silver, for instance, $Ag_2Se$, $Ag_{2+x}Se$, and $Ag_{2-x}Se$.

The term "chalcogenide glass" is intended to include glasses that comprise an element from group VIA (or group 16) of the periodic table. Group VIA elements, also referred to as chalcogens, include sulfur (S), selenium (Se), tellurium (Te), polonium (Po), and oxygen (O).

The present invention is directed toward chalcogenide glass constant current devices and their methods of formation and operation. The chalcogenide constant current structures disclosed herein can be utilized for any number of applications where a constant current is needed over a range of applied voltages.

The invention will now be explained with reference to FIGS. 1–9, which illustrate exemplary embodiments of a chalcogenide constant current device 100 and 101, and its method of formation and operation, in accordance with the invention.

Figure 1:
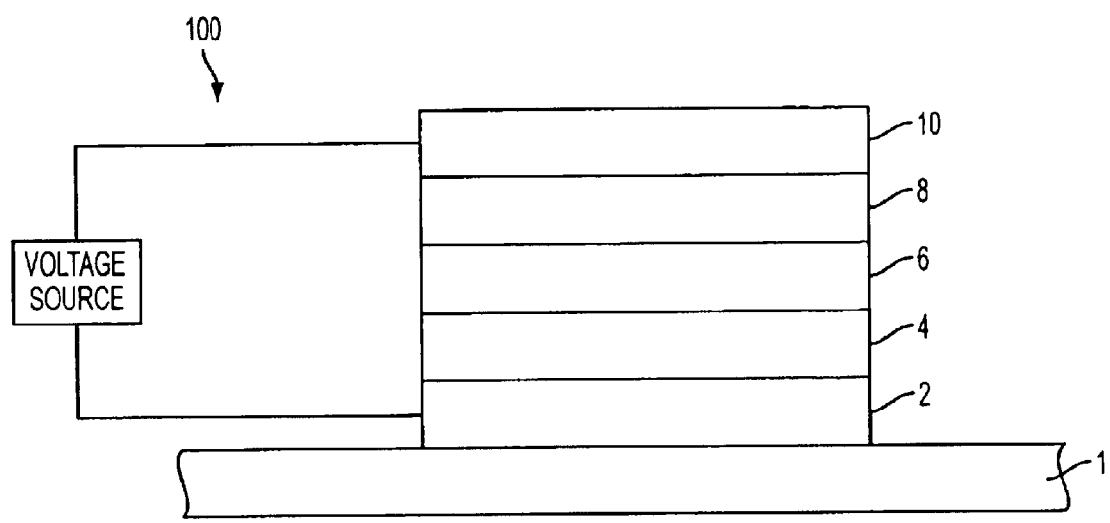
FIG. 1 illustrates a cross-sectional view of a chalcogenide glass constant current device fabricated in accordance with a first embodiment of the invention.

FIG. 1 depicts a first embodiment of a chalcogenide constant current device constructed in accordance with the invention. A first electrode 2 is formed over a substrate 1. The first electrode 2 may comprise any conductive material so long as the constant current device's electrical properties are not altered. For example, various metals, such as, one or more of tungsten, nickel, tantalum, aluminum, platinum, or titanium nitride among many others. In addition, the first electrode 2 can comprise a conductively-doped semiconductive material. However, care must be used since some metals, such as Ag, Au, or Cu, may migrate into a subsequently deposited glass layer and alter the electrical behavior of the constant current device.

For purposes of a simplified description, the first electrode 2 is described as comprising tungsten (W). Although FIG. 1 illustrates a first electrode 2 provided on substrate 1, it should be appreciated that additional layers may be provided beneath electrode 2, between it and the substrate 1. For instance, a semiconductor substrate containing circuit layers covered with an insulating layer can be provided below first electrode 2 if desired. The presence of additional underlying layers between electrode 2 and substrate 1 does not affect the utility of the invention.

Next, a first chalcogenide glass layer 4 is formed over the first conductive electrode 2. The chalcogenide glass layer 4 is electrically coupled to electrode 2.

The first chalcogenide glass layer 4 is preferably a germanium-selenide glass having a $Ge_xSe_{100-x}$ stoichiometry. The stoichiometric range for the first chalcogenide glass layer 4 is from about $Ge_{18}Se_{82}$ to about $Ge_{43}Se_{57}$, but is preferably from about $Ge_{25}Se_{75}$ to about $Ge_{40}Se_{60}$, and is more preferably about $Ge_{40}Se_{60}$.

The first chalcogenide glass layer 4 has a thickness that ranges from about 150 Angstroms (Å) to about 400 Å. Preferably, the first chalcogenide glass layer 4 has a thickness of about 250 Å to about 300 Å. For purposes of a simplified description, the first chalcogenide glass layer 4 is described further below as a $Ge_{40}Se_{60}$ layer. The first chalcogenide glass layer 4 acts as a glass backbone and allows a metal-containing layer, such as a silver-selenide or a chalcogenide-doped with silver (Ag) layer, to be directly formed thereon.

The formation of the first chalcogenide glass layer 4, having a stoichiometric composition, such as $Ge_{40}Se_{60}$ in accordance with one exemplary embodiment of the invention, can be accomplished by any suitable method. For instance, evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry, are non-limiting examples of methods which can be used to form the first chalcogenide glass layer 4.

Still referring to FIG. 1, a metal-containing layer 6, preferably a silver-selenide layer, is formed over the first chalcogenide glass layer 4. However, any suitable metal-containing layer 6 may be used so long as it contains an adequate source of metal ions, which can move in and out of chalcogenide glass layers during device operation. For instance, besides silver-selenide, the metal-containing layer 6 may be silver. Other suitable metal-containing layers 6 include all chalcogenide layers doped Ag such as chalcogenides O, S, Se, Te, and Po. Silver sulfide, silver oxide, and silver telluride, for example, among others, are all suitable silver-chalcogenides that may be used as metal-containing layer 6.

A variety of processes can be used to form the metal-containing layer 6. Some non-limiting examples are physical vapor deposition techniques such as evaporative deposition, sputtering, co-sputtering, starting with an Ag containing chalcogenide source. Other non-limiting processes such as chemical vapor deposition, co-evaporation, depositing a layer of selenium above a layer of silver to form silver-selenide, or chemical bath deposition of a silver-selenide layer can also he used. FIG. 1 illustrates that the metal-containing layer 6 is in contact with the upper surface of the first chalcogenide glass layer 4; however, intervening layers may also be provided between layers 4 and 6, as long as they permit the resulting device to operate in a constant current mode.

Metal-containing layer 6 is formed to a thickness that ranges from about 200 Å to about 2000 Å. Preferably, the metal-containing layer 6 is about 600 Å thick.

Still referring to FIG. 1, a second chalcogenide glass layer 8 is formed over the metal-containing layer 6. FIG. 1 illustrates that the second chalcogenide glass layer 8 is in contact with the upper surface of the metal-containing layer 6; however, intervening layers may also be provided between layers 6 and 8, so long as they permit the resulting device to operate in a constant current mode.

The second chalcogenide glass layer 8 is preferably a germanium-selenide glass having a $Ge_xSe_{100-x}$ stoichiometry. The stoichiometric range for the second chalcogenide glass layer 8 is from about $Ge_{18}Se_{82}$ to about $Ge_{43}Se_{57}$, preferably from about $Ge_{25}Se_{75}$ to about $Ge_{40}Se_{60}$, and is more preferably about $Ge_{40}Se_{60}$. The second chalcogenide glass layer 8 preferably has a thickness that ranges from about 50 Å to about 500 Å. More preferably, the second chalcogenide glass layer 8 is about 150 Å thick.

Although the first chalcogenide glass layer 4 and second chalcogenide glass layer 8 are described above as having a stoichiometry similar to each other, e.g., about $Ge_{40}Se_{60}$, it should be appreciated that the first chalcogenide glass layer 4 and the second chalcogenide glass layer 8 can possess different stoichiometries from each other, and they can even he different glasses. For instance, the first chalcogenide glass layer 4 can possess a stoichiometry of $Ge_{40}Se_{60}$ while the second chalcogenide glass layer 8 can possess a stoichiometry of $Ge_{25}Se_{75}$. For purposes of a simplified description, the second chalcogenide glass layer 8 is described further below as having a stoichiometry of $Ge_{40}Se_{60}$.

The formation of the second chalcogenide glass layer 8, can be accomplished by any suitable method as described above with reference to formation of the first chalcogenide glass layer 4.

Figure 1A:
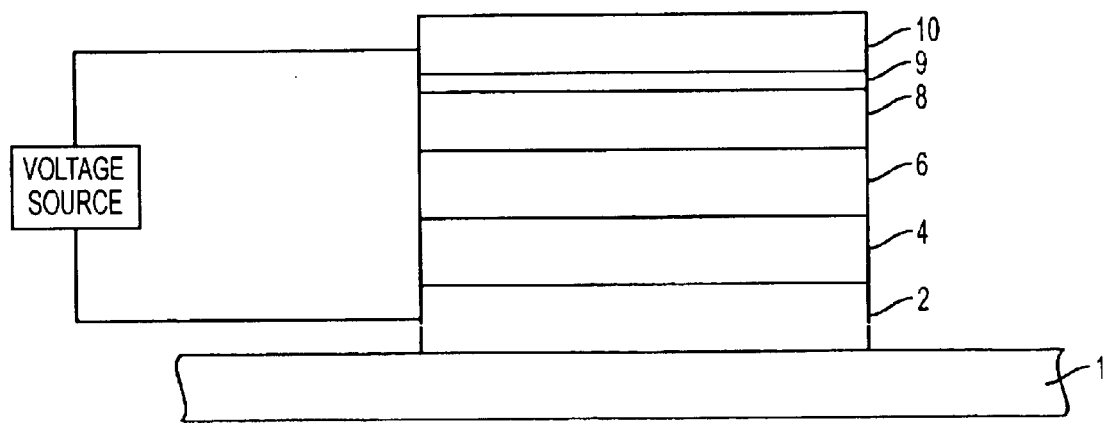
FIG. 1a illustrates a cross-sectional view of a chalcogenide glass constant current device fabricated in accordance with a first exemplary embodiment of the first embodiment of the invention.
Figure 1B:
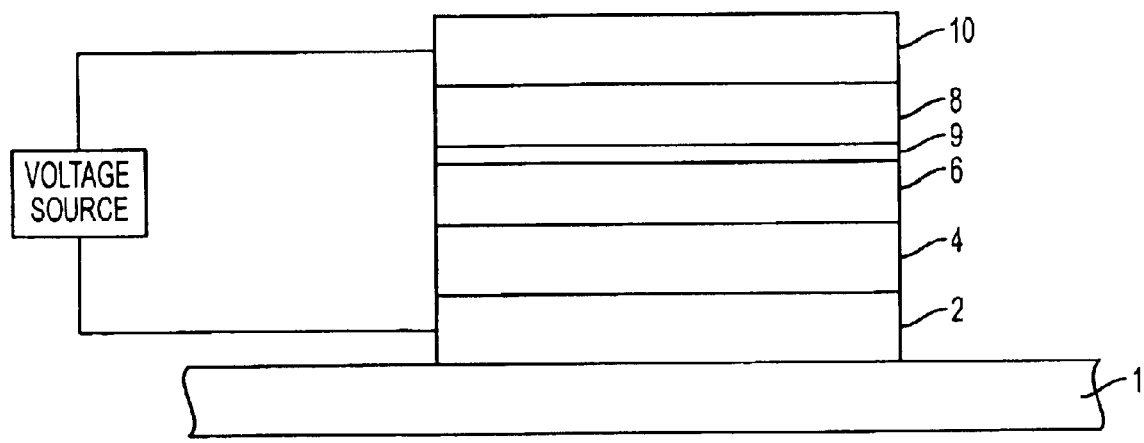
FIG. 1b illustrates a cross-sectional view of a chalcogenide glass constant current device fabricated in accordance with a second exemplary embodiment of the first embodiment of the invention.
Figure 1C:
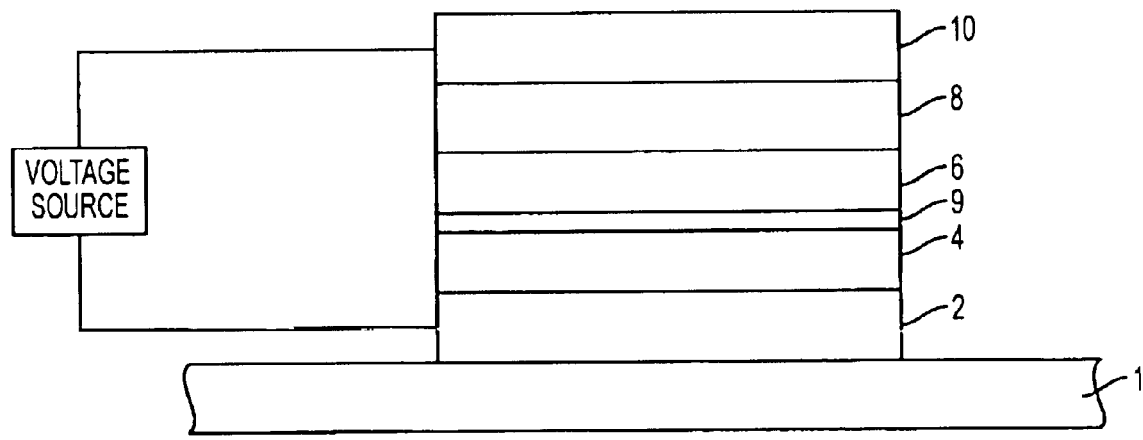
FIG. 1c illustrates a cross-sectional view of a chalcogenide glass constant current device fabricated in accordance with a third exemplary embodiment of the first embodiment of the invention.

As an alternative embodiment, depicted in FIG. 1a, an additional layer 9, such as Ag, can be provided above the second chalcogenide glass layer 8. Alternatively, layer 9 can be provided above (FIG. 1b) or below (FIG. 1c) metal-containing layer 6, e.g., $Ag_2Se$, rather than above the second chalcogenide glass layer 8 (FIG. 1a). In FIGS. 1a–1c, layer 9 is preferably an Ag layer that is less than or equal to about 500 Å thick, and more preferably is an Ag layer that is approximately 200 Å thick. Layer 9 can be deposited using any techniques well-known in the art. It is not ideal to have an Ag source provided strictly by electrode 10. Accordingly, care must be taken to limit the Ag source for long-term temperature stability and endurance. The presence of layer 9 addresses this concern. However, the presence of layer 9 is not required.

Figure 1D:
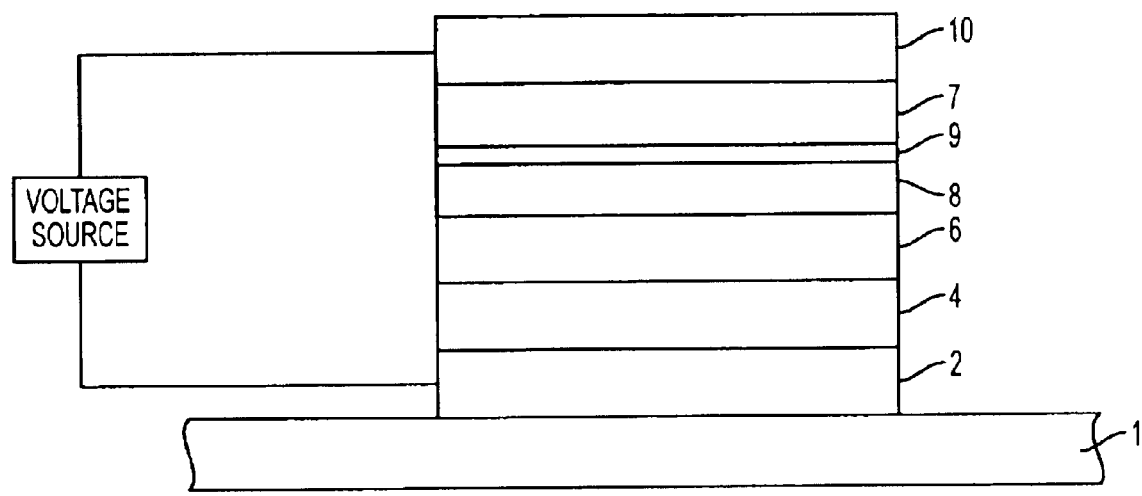
FIG. 1d illustrates a cross-sectional view of a chalcogenide glass constant current device fabricated in accordance with yet another exemplary embodiment of the first embodiment of the invention.

Further, in yet another alternative embodiment of FIG. 1, depicted in FIG. 1d, a constant current device can be fabricated where a third glass layer 7, analogous to glass layer 8, can be provided between layer 9 and the top electrode 10. Similar to the embodiments depicted in FIGS. 1a–1c, layer 9 is preferably an Ag layer that is less than or equal to about 500 Å thick, and more preferably is an Ag layer that is approximately 200 Å thick.

Referring back to FIG. 1, a second electrode 10 is formed over the second chalcogenide glass layer 8, to complete the formation of the chalcogenide constant current device 100. The second electrode 10 may comprise any conductive material so long as the constant current device's electrical properties are not altered. For example, various metals, such as, one or more of tungsten, nickel, tantalum, aluminum, platinum, silver, or titanium nitride among many others. However, care must be used since some metals, such as Ag, Au, or Cu, may migrate into a subsequently deposited glass layer and alter the electrical behavior of the constant current device.

In addition, the second electrode 10 can comprise a conductively-doped semiconductive material. FIG. 1 illustrates that the second electrode 10 is in contact with an upper surface of the second chalcogenide glass layer 8; however, intervening layers may also be provided between layers 8 and 10, as long as they permit the resulting device to operate in a constant current mode.

It should be appreciated that the first electrode 2 and the second electrode 10 can comprise the same material or different materials. As examples, the first electrode 2 and second electrode 10 can each be made of tungsten, or preferably, the first electrode 2 can comprise tungsten and the second electrode 10 can comprise silver. As described previously, it is not ideal to have an Ag source provided strictly by electrode 10. Accordingly, care must be taken to limit the Ag source for long-term temperature stability and endurance.

After forming the second electrode 10, a negative electrical pulse of absolute amplitude greater than the erase potential of the device is applied to structure 100 in order to have the device exhibit constant current behavior. Conventionally, a stricture 100 fabricated as shown in FIG. 1, can be operated as a normal PCRAM memory device. For example, in DC operation, the device 100 can be read when a potential of approximately 100 mV is applied across conductors 10 and 2, a voltage of approximately 250 mV or greater is applied across conductors 10 and 2 to write it, and a negative potential of absolute amplitude greater than approximately negative 80 mV is applied to conductors 10 and 2 to erase it.

However, Applicants have discovered that when a negative electrical pulse that is significantly more negative than the erase potential is applied across conductors 10 and 2, the structure's electrical behavior is altered and it exhibits constant current source behavior rather than memory behavior. When in the constant current mode, a wide range of negative voltages can be applied across such a device without changing the device's current flow. The amplitude of the negative pulse signal that switches a device into constant current mode, e.g., significantly more negative than the PCRAM device's erase potential, will vary depending upon the thickness of the respective chalcogenide glass layers and the amount of metal, e.g., silver (Ag) present in the chalcogenide layer 4.

A first exemplary structure 100 was formed in accordance with the FIG. 1 embodiment of the invention in which the first electrode 2 comprised tungsten, the first chalcogenide glass layer 4 comprised a $Ge_{40}Se_{60}$ layer about 300 Å thick, the metal-containing layer 6 comprised an Ag$_2$Se layer about 600 Å thick, the second chalcogenide glass layer 8 comprised a Ge$_{40}$Se$_{60}$ layer about 150 Å thick, and the second electrode 10 comprised an Ag electrode.

When a negative voltage typically within the range from about negative 1.0 V (−1.0 V) to about negative 2.0 V (−2.0 V), with a pulse of about 8 ns to at least about 30 ns, was applied across electrodes 10 and 2, the exemplary structure 100 operated as a constant current device. A device fabricated in this manner provided a constant current of about negative 8 µA across an applied voltage range of about negative 100 mV (−100 mV) to at least about negative 800 mV (−800 mV), as graphically shown in FIG. 3. When the voltage becomes more negative than approximately −800 mV, the constant current behavior of the exemplary structure 100 begins to deteriorate. It was also found that devices fabricated in this manner permanently converted from a memory device into a constant current operation device.

Figure 3:
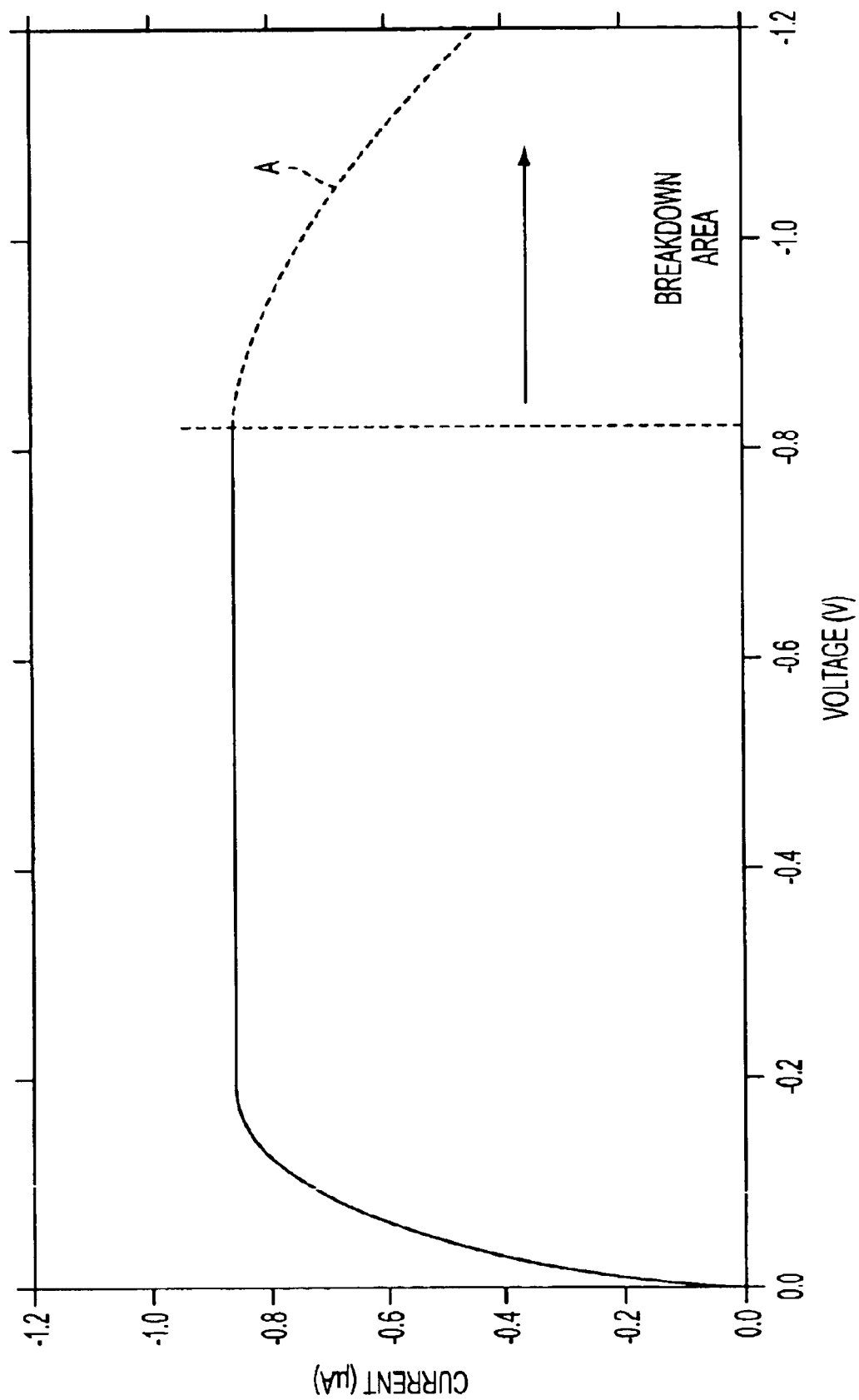
FIG. 3 is a graph illustrating a current-voltage (I–V) curve of a chalcogenide constant current device constructed in accordance with the invention.

Although FIG. 3 illustrates a constant current of about negative 8 µA across a voltage range of about −100 mV to about −800 mV, it should be appreciated that the exact constant current value and voltage range will depend upon the structural properties of the device, such as the precise composition and thickness of layers 4, 6, and 8, and the total amount of metal, e.g., silver, present in the chalcogenide layer 4.

Further, as noted above regarding the FIG. 1 embodiment, the first chalcogenide layer 4 and second chalcogenide layer 8 do not have to possess the same stoichiometries, nor do the first chalcogenide layer 4 and second chalcogenide layer 8 have to possess the same thickness. A constant current device 100 fabricated as described with reference to FIG. 1 can be of any geometric shape as desired or needed for a particular application.

As a second and more specific exemplary example, a constant current device was fabricated in accordance with a FIG. 1 embodiment of the invention in which the first electrode 2 comprised tungsten, the first chalcogenide layer 4 comprised a Ge$_{40}$Se$_{60}$ glass about 300 Å thick, the metal-containing layer 6 comprised an Ag$_2$Se layer about 600 Å thick, the second glass layer 8 comprised a Ge$_{25}$Se$_{75}$ glass about 150 Å thick, and the second electrode 10 comprised tungsten.

When a negative potential of 1.5 V (−1.5 V) with a 30 ns pulse was applied to the fabricated device, the device exhibited constant current behavior rather than memory behavior. Applicants further learned that applying a negative potential anywhere in the voltage ranges from about −1.0 V to about −2.0 V with a 30 ns pulse to the fabricated device, also generated constant current behavior. However, it was found that applying a negative 900 mV, 30 ns pulse did not cause the fabricated device exhibit constant current behavior.

Similar to the first exemplary device, the second exemplary structure 100, maintained a constant current over an applied negative voltage range of about −100 mV to about −800 mV. Accordingly, the constant current observable voltage range was at least approximately 700 mV once a negative electrical 30 ns pulse in the range of about −1.0 V to about −2.0 V was applied across conductors 10 and 2.

In a third exemplary example of the FIG. 1 embodiment, a structure 100 was fabricated including a first electrode 2 comprising tungsten, a layer 4 comprising Ge$_{40}$Se$_{60}$ glass about 150 Å thick, a metal-containing layer 6 comprising Ag$_2$Se about 600 Å thick, a glass layer 8 comprising Ge$_{40}$Se$_{60}$ glass about 150 Å thick, and a second electrode 10 comprising silver. A negative 8 ns electrical pulse of about negative 800 mV (−800 mV) was then applied to the fabricated device.

As a result, this device also exhibited constant current behavior rather than memory behavior. The fabricated device maintained a constant current over an applied negative voltage range of at least approximately 700 mV, specifically from about −100 mV to about −800 mV, after a negative 8 ns electrical pulse of about −800 mV was applied across electrodes 10 and 2 to convert the structure to a constant current mode. As is evident from the third exemplary example, the total amount of silver present in the device seems to affect the magnitude of the negative potential that needs to be applied to switch a device 100 into constant current mode.

Figure 2:
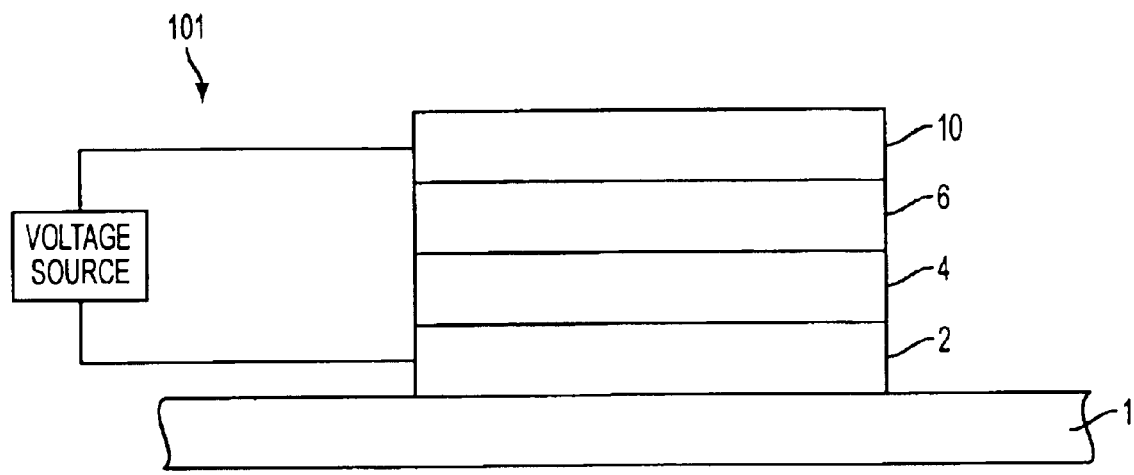
FIG. 2 illustrates a cross-sectional view of a chalcogenide glass constant current device fabricated in accordance with a second embodiment of the invention.

Reference is now made to FIG. 2 which shows another exemplary embodiment of the invention and its method of formation.

The FIG. 2 embodiment illustrates a first electrode 2 provided over a substrate 1. The first electrode 2 may comprise any of the conductive materials listed above for the same electrode as in the FIG. 1 embodiment. For purposes of a simplified description, the first electrode 2 is described as tungsten (W). Similar to the FIG. 1 embodiment, additional layers may be provided between electrode 2 and substrate 1.

Next, a chalcogenide glass layer 4 is formed over the first electrode 2. Although FIG. 2 is described without intervening layers between the first electrode 2 and chalcogenide glass layer 4, intervening layers may be present so long as they do not prevent operation of the FIG. 2 structure in a constant current mode. The chalcogenide glass layer 4 is preferably a germanium-selenide glass having a Ge$_x$Se$_{100-x}$ stoichiometry. The stoichiometric range for the chalcogenide glass layer 4 is from about Ge$_{18}$Se$_{82}$ to about Ge$_{44}$Se$_{57}$, is preferably from about Ge$_{25}$Se$_{75}$ to about Ge$_{40}$Se$_{60}$, and is more preferably about Ge$_{40}$Se$_{60}$. The chalcogenide glass layer 4 has a thickness that ranges from about 150 Å to about 400 Å. Preferably, the chalcogenide glass layer 4 in the FIG. 2 embodiment has a thickness of about 250 Å to about 300 Å.

The formation of the chalcogenide glass layer 4, having a stoichiometric composition, such as Ge$_{40}$Se$_{60}$ in accordance with one exemplary embodiment of the invention, can be accomplished by any of the methods described above for forming glass layers 4 or 8 of FIG. 1.

Still referring to FIG. 2, a metal-containing layer 6, preferably silver-selenide, is deposited over the chalcogenide glass layer 4. However, any suitable metal-containing layer 6 may be used so long as it contains an adequate source of metal ions, e.g., silver, which can move in and out of chalcogenide glass layer 4 during device operation. For instance, besides silver-selenide, the metal-containing layer 6 may be silver. Other suitable metal-containing layers include all chalcogenide layers containing Ag, e.g., chalcogenides O, S, Se, Te, and Po. Silver sulfide, silver oxide, and silver telluride, for example, among others, are all suitable silver-chalcogenides that may be used as metal-containing layer 6, e.g., a chalcogenide layer containing Ag.

Metal-containing layer 6 can be formed by any of the methods described above in connection with forming metal-containing layer 6 of the FIG. 1 embodiment. FIG. 2 illustrates that the metal-containing layer 6 is in contact with the upper surface of the chalcogenide glass layer 4; however, intervening layers may be present below metal-containing layer 6 so long as they do not prevent operation of the FIG. 2 structure in a constant current mode. Metal-containing layer 6 is formed to a thickness that ranges from about 200 Å to about 2000 Å. Preferably, the metal-containing layer 6 is about 600 Å thick.

Figure 2A:
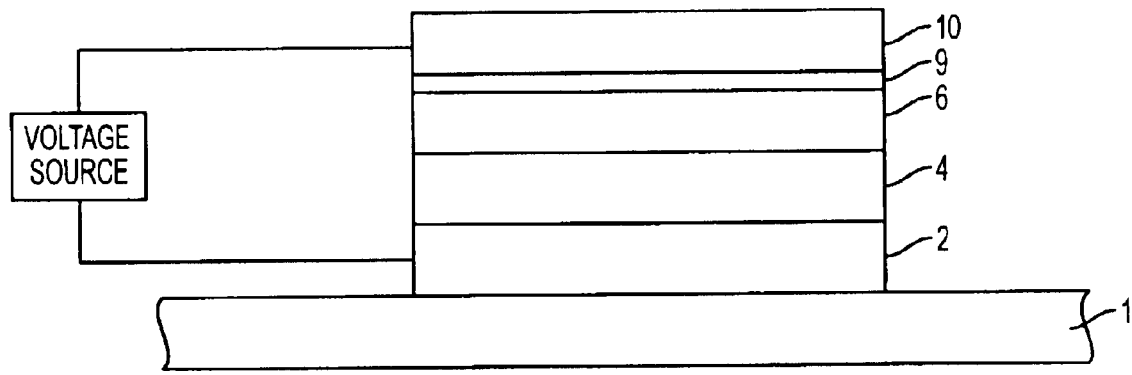
FIG. 2a illustrates a cross-sectional view of a chalcogenide glass constant current device fabricated in accordance with a first exemplary embodiment of the second embodiment of the invention.
Figure 2B:
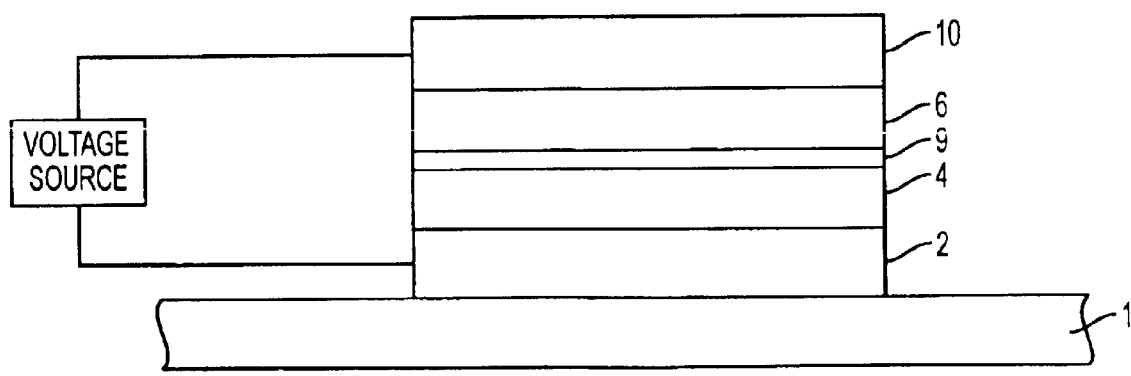
FIG. 2b illustrates a cross-sectional view of a chalcogenide glass constant current device fabricated in accordance with a second exemplary embodiment of the second embodiment of the invention.

As an alternative embodiment depicted in FIG. 2a, an additional layer 9, such as Ag, can be provided above the metal-containing layer 6, e.g., $Ag_2Se$, between the second electrode 10 and the metal-containing layer 6. Alternatively, an additional layer 9, similar to the FIG. 2a embodiment, can be provided below metal-containing layer 6, between the first chalcogenide layer 4 and metal-containing layer 6. In FIG. 2a, layer 9 is preferably an Ag layer that is less than or equal to 500 Å thick, and more preferably an Ag layer that is approximately 200 Å thick. Similar to the concerns for the exemplary FIGS. 1a–1d embodiments, care must be taken to limit the Ag source for long-term temperature stability and endurance. The presence of layer 9 addresses this concern. Again, the presence of layer 9 is not required.

Referring back to FIG. 2, a second electrode 10 is formed over the metal-containing layer 6 to complete the formation of the chalcogenide constant current device 101, in accordance with the second embodiment. Further, although FIG. 2 is described without intervening layers between the metal-containing layer 6 and the second electrode 10, intervening layers may be present so long as they do not prevent operation of the FIG. 2 structure in a constant current mode. The second electrode 10 may comprise any of the materials described above for electrode 10 in the FIG. 1 embodiment. However, when the second electrode 10 of FIG. 2 is in direct contact with metal-containing layer 6, the second electrode 10 should preferably not comprise silver unless it is sputtered onto an $Ag_2Se$ layer acting as metal-containing layer 6.

It should be appreciated that the first electrode 2 and the second electrode 10 of FIG. 2 can comprise the same material or different materials. As examples, the first electrode 2 and second electrode 10 can each be made of tungsten, or alternatively, the first electrode 2 can comprise tungsten and the second electrode 10 can comprise silver.

After the FIG. 2 structure 101 is formed, a negative electrical potential of sufficient magnitude can be applied across electrodes 10 and 2 to cause the device to exhibit constant current behavior. Conventionally, a device fabricated as shown in FIG. 2, can be operated as a normal PCRAM memory device. For example, in DC operation, the device can be read when a potential of approximately 100 mV is applied across conductors 10 and 2, a voltage of approximately 250 mV or greater is applied across conductors 10 and 2 to write it, and a negative potential of absolute amplitude greater than approximately negative 80 mV is applied to conductors 10 and 2 to erase it.

However, when a negative electrical pulse that is significantly more negative than the erase potential of structure 101 is applied across conductors 10 and 2, the structure's electrical behavior is altered and it exhibits constant current source behavior rather than memory behavior. When in the constant current mode, a wide range of negative voltages can be applied across such a device without changing the device's current flow. The amplitude of the negative pulse signal that switches a device into constant current mode, e.g., significantly more negative than the PCRAM device's erase potential, will vary depending upon the thickness of the respective chalcogenide glass layer and the amount of metal, e.g., silver (Ag) present in the chalcogenide layer 4.

In a first exemplary example of the FIG. 2 embodiment, a constant current device was fabricated in which the first electrode 2 comprised tungsten, the first layer 4 comprised a $Ge_{40}Se_{60}$ glass about 300 Å thick, the metal-containing layer 6 comprised an $Ag_2Se$ layer about 600 Å thick, and the second electrode 10 comprised tungsten.

A negative electrical 30 ns potential of 1.5 V (−1.5 V) was applied to the fabricated exemplary device. As a result, this device exhibited constant current behavior rather than memory behavior. It was further found that applying an electrical negative 30 ns potential that ranged from about −1.0 V to about −2.0 V to the fabricated device also generated constant current behavior. However, when a more positive electrical pulse than −1.0 V was applied, for example, a negative 900 mV, 30 ns pulse, it was observed that this did not convert the exemplary device 101 into a constant current mode.

The exemplary device 101 maintained a constant current over an applied negative voltage range of about −100 mV to about −800 mV. Accordingly, the constant current observable voltage range is at least approximately 700 mV once a negative voltage in the range of about −1.0 V to about −2.0 V is applied across conductors 10 and 2.

In a second exemplary example of the FIG. 2 embodiment, a structure 101 was fabricated including a first electrode 2 comprising tungsten, a layer 4 comprising $Ge_{40}Se_{60}$ glass about 150 Å thick, a metal-containing layer 6 comprising $Ag_2Se$ about 600 Å thick, and a second electrode 10 comprising silver. A negative potential of 800 mV (−800 mV) with a 8 ns pulse was applied to the fabricated device. As a result, this device also exhibited constant current behavior rather than memory behavior. As is evident from the second exemplary example, the total amount of silver present in the device 101 seems to affect the magnitude of the negative potential that needs to be applied to switch a device into constant current mode.

The fabricated device maintained a constant current over an applied negative voltage range of at least approximately 700 mV, specifically from about −100 mV to about −800 mV, when a negative electrical potential of about −800 mV was applied across electrodes 10 and 2. As with the FIG. 1 embodiment, the FIG. 2 embodiment can be of any geometric shape depending upon the desired or needed application.

Applicants have discovered that devices 100 and 101 fabricated in accordance with the embodiments of the present invention, which normally exhibit PCRAM memory behavior, can be permanently converted to a constant current device by applying a negative voltage across the device in excess of the negative voltage required to switch the device from a memory device to a constant current device. Stated another way, applying a significantly more negative electrical pulse than the device's erase potential converts the memory device into a constant current device. It was also observed that the greater the amount of Ag present in the constant current devices 100 and 101, a larger absolute amplitude, negative potential 8 ns pulse or a pulse of larger absolute amplitude at various widths could also be applied to devices 100 and 101 to induce constant current behavior.

Applicants further discovered that devices 100 and 101 fabricated in accordance with the invention, can be operated as a constant current device without first operating as a memory device, upon application of a negative electrical pulse sufficient to place the device in a constant current mode of operation. Conversely, devices 100 and 101 fabricated in accordance with the invention may be operated as a memory device without first operating then as a constant current device by application of voltages below the threshold required to place the device in a constant current mode.

As a result, upon application of a negative pulse sufficient to place the memory device in a constant current mode of operation, the device converts to a constant current mode and remains in that state even when voltage is removed.

In another aspect, the invention provides methods for changing and resetting the current level which passes through constant current devices 100 and 101 such as described in FIGS. 1 and 2, when in a constant current operation mode.

For purposes of a simplified description, the methods of changing and resetting are described with respect to a fabricated 100 structure of FIG. 1. However, the methods are equally effective when applied to the FIG. 2 structure 101.

In particular, an exemplary stricture 100 formed in accordance with FIG. 1 is described below in reference to FIG. 3, comprises a bottom tungsten electrode 2, a $Ge_{40}Se_{60}$ first glass layer 4 about 300 Å thick, a $Ag_2Se$ layer 6 about 600 Å thick, a $Ge_{40}Se_{60}$ second glass layer 8 about 150 Å thick, and a top silver electrode 10. Thus, when the structure 100 of FIG. 1 is in a constant current mode and a DC voltage in the range of approximately 0 to approximately −1.0 V is applied across electrodes 10 and 2, the device has the current/voltage curve (I/V curve) as illustrated in FIG. 3.

FIG. 3 illustrates an observed region A beyond about −800 mV where the constant current value of −8 $\mu A$ begins to decline for the constant current devices of the invention. Stated in another way, region A is where the constant current value is no longer maintained at −8 $\mu A$. It has been observed that Region A corresponds to a reset region or breakdown area of a chalcogenide constant current device 100. Specifically, when structure 100 is in constant current operation mode, as depicted in FIG. 3, the constant current value of the device can be reset to its initial constant current value, for example −8 $\mu A$, by applying a more negative voltage greater than the negative voltage threshold of the device. The initial constant current value is the initial current value of the chalcogenide structure when it is first switched to exhibit constant current behavior.

A constant current device can prematurely degrade if the applied potential is increased too much above the point where the constant current device starts to reduce the constant current value as illustrated in FIG. 3. The degradation of the constant current device can eventually lead to DNR behavior. However, the increase in the constant current's value can occur with a repeated pulse of similar or less amplitude as initially used to cause the device to exhibit constant current behavior. Further, after a certain negative electrical potential corresponding to region A, a constant current device will not reset to its initial constant current value. The constant current device's function is killed. A more preferable method of resetting a constant current device's constant current value is applying a more positive electrical potential.

Still referring to FIG. 3, it should be appreciated that although the constant current level is depicted as −8 $\mu A$, the constant current value will vary depending upon the thickness of the glass stack fabricated in accordance with the embodiments of FIGS. 1 and 2, and also depending upon the total amount of Ag in devices 100 and 101. Further, although region A is observed beyond about −800 mV in FIG. 3, region A's location can also vary, e.g., be greater or less than the value depicted in FIG. 3, depending upon the thickness of the glass stack, total amount of silver, and applied negative voltage. Still further, although FIG. 3 illustrates that the device maintains a constant current of at least 700 mV, the thickness of the glass stack, total amount of silver, and magnitude of the applied negative voltage, will also affect the device's range for maintaining a constant current value, e.g., a constant current device can possess a greater constant current range than depicted.

Thus, in one method aspect provided by the invention, region A of FIG. 3 corresponds to a negative breakdown voltage which can be applied to a constant current structure 100 or 101 to reset the structure's constant current value to the original value observed when structures 100 or 101 was initially switched to constant current mode. In another aspect provided by the invention, FIG. 3 also illustrates a method for changing the constant current value of device 100.

Applicants have discovered that applying a negative potential, up to a certain value increases the constant current's amplitude. Repeated current pulses of similar or less amplitude can further increase the constant current's amplitude. The negative potential necessary to increase the constant current's amplitude will vary depending upon the structural characteristics of the constant current device. Conversely, applying a positive potential decreases the constant current's amplitude. Similarly, repeated current pulses of similar or less amplitude can further decrease the constant current's amplitude. Again, the positive potential necessary to decrease the constant current's amplitude will vary depending on the structural characteristics of the constant current device. Further details are provided below.

Figure 4:
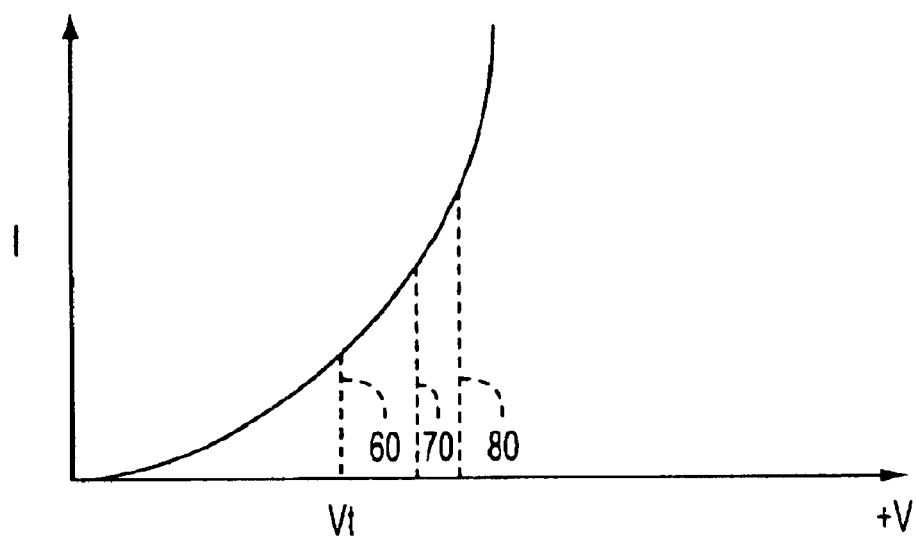
FIG. 4 is a graph illustrating the application of different positive voltages to decrease a constant current device's constant current amplitude.
Figure 5:
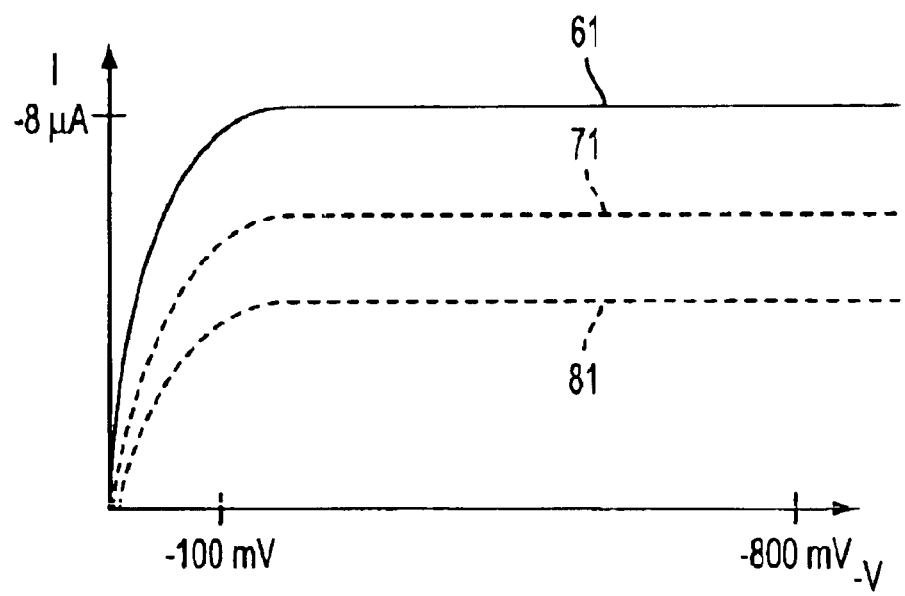
FIG. 5 is a graph illustrating the constant current achieved as a result of applying the voltage illustrated in FIG. 4 to a chalcogenide constant current device.

Typically, when structure 100, operating in constant current mode, is written with a positive voltage 60 which approximately is of larger absolute amplitude than a voltage threshold (Vt) value shown in FIG. 4; this signal decreases the value of the constant current limit, e.g., makes smaller in magnitude, as shown in FIG. 5. For purposes of a simplified description, this voltage is described as $V_1$. FIG. 5 illustrates a constant current limit 61, after a positive voltage 60, e.g., $V_1$ is applied to structure 100 that is larger than the Vt shown in FIG. 4.

It should be appreciated that, as FIG. 4 illustrates, the magnitude of $V_1$'s which can be applied to constant current structure 100 can be of a larger absolute amplitude than positive Vt voltage 60. Referring now to FIG. 5, which illustrates various $V_1$'s, graph 61 corresponds to the applied positive Vt voltage 60 of FIG. 4, graph 71 corresponds to the applied positive voltage 70 of FIG. 4, and graph 81 corresponds to the applied positive voltage 80 of FIG. 4. FIG. 4 illustrates only a small number of $V_1$'s that can be applied to induce a larger constant current value, e.g., decreasing the constant current's amplitude. As a result, FIG. 5 illustrates only a small number of constant current values that can result from an applied positive voltage to structure 100 operating in constant current mode. Further, FIG. 5 illustrates that repeated current pulses of similar or less amplitude can further decrease the constant current's amplitude as graphs 61, 71, and 81 illustrate.

Accordingly, applying a positive voltage, e.g., $V_1$, greater than Vt to structure 100 when operating in the constant current mode results in a decreased constant current amplitude than initially observed when structure 100 was first switched to operate in constant current mode. For example, if the constant current device has an initial constant current value of −8 $\mu A$ as illustrated in FIG. 3, a positive voltage 70 can be applied to achieve a new constant current value illustrated in FIG. 5, graph 71. Stated another way, $V_1$ is applied to the structure reducing the constant current strength. The constant current value can be continuously decreased if desired. Therefore, applying a positive voltage, e.g., $V_1$, to constant current devices 100 and 101 allows one to change the constant current value to a lower constant current value than the device initially exhibited.

In another method aspect, the invention provides a method of increasing or resetting the high constant current value achieved with the methods described previously in reference to FIGS. 4 and 5. To increase the high constant current values illustrated in FIG. 5 from graphs 61, 71, and 81, a voltage more negative than a negative threshold voltage (Vt) needs to be applied to structure 100. This voltage is also known as the breakdown voltage of the device. For purposes of a simplified description, this voltage is described as $V_2$.

Figure 6:
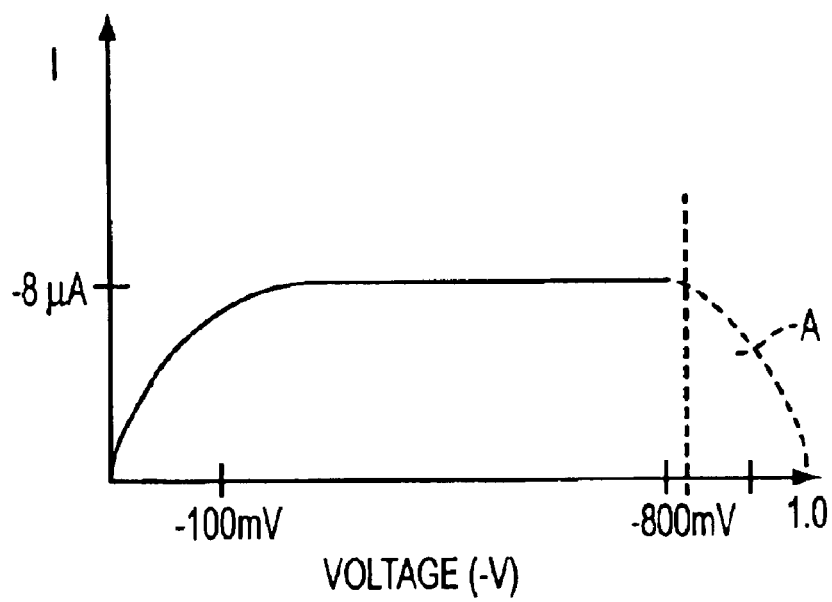
FIG. 6 is a graph illustrating the breakdown voltage of a chalcogenide constant current device.

FIG. 6 illustrates in region A (analogous to region A of FIG. 3), the breakdown voltage of a constant current device 100 utilizing the constant current limit graph 60 of FIG. 5. A negative threshold voltage ($V_2$) is applied at a voltage slightly more negative than the upper voltage limit range for the existing constant current level, defined as the breakdown voltage of the device.

For instance, FIG. 6 illustrates that negative 800 mV (−800 mV) is about the upper voltage limit range for the existing constant current value of structure 100. Therefore, a $V_2$ must be applied that is slightly more negative than −800 mV as FIG. 6 illustrates. Specifically, the breakdown voltage of constant current device 100 is provided by Region A, which is slightly more negative than −800 mV.

Accordingly, FIG. 6 illustrates applying $V_2$ which is more negative than about −800 mV to constant current structure 100. Preferably, a more negative $V_2$ of equal to or greater than −1.0 V is applied to reset the constant current value of structure 100. However, other negative $V_2$ values can be used so long as they are greater than the constant current value's upper voltage limit range of structure 100, e.g., a $V_2$ greater than at least −800 mV. For instance, referring back to FIG. 3, FIG. 3 illustrates that the constant current's upper voltage limit range is approximately −800 mV for constant current structure 100. Thus, a slightly more negative $V_2$ is applied. This is illustrated by Region A. As discussed previously, the exact breakdown voltage and the amplitude of this negative signal, e.g., $V_2$, will vary depending upon the thickness of the glass layers and the amount of Ag within the constant current device. Further, applying a more negative electrical signal than −800 mV serves to increase the constant current's negative value.

Figure 7:
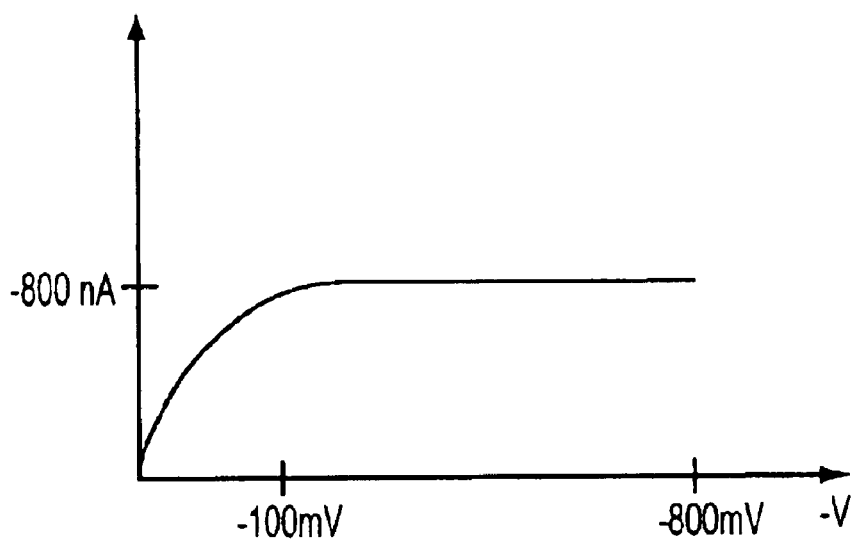
FIG. 7 is a graph illustrating the I–V characteristics of a chalcogenide constant current device after a bias voltage described with reference to FIGS. 5–6 is applied.

Thus, applying a $V_2$ which corresponds to the breakdown voltage of the constant current device raises die existing constant current value, e.g., the existing constant current value becomes more negative or increases the constant current's amplitude. In other words, applying a more negative voltage that corresponds to region A of FIGS. 3 and 6, can either reset the constant current limit of structure 100 to the original constant current limit or at least raise the constant current value, e.g., make more negative, of the constant current device as FIG. 7 illustrates. Further, repeated current pulses of similar or less amplitude can further increase the constant current's amplitude as desired.

Specifically, FIG. 7 illustrates that the constant current value of structure 100 is raised, e.g., from about −8 μA as FIG. 6 illustrates, to about negative 800 nA (−−800 nA). As a result, a new higher constant current value is achieved, e.g., more negative constant current value. Particularly, the higher constant current value achieved corresponds to the original negative constant current value of the constant current device. As FIG. 7 illustrates, the constant current value is significantly higher, e.g., more negative.

Typically, applying a negative $V_2$ that is more negative than from about −800 mV to about −2.0 V results in a breakdown voltage allowing the constant current limit to be reset or raised in a constant current device. However, in general, applying a more negative $V_2$ greater than −2.0 V results in the constant current device being destroyed. Therefore, it is preferable that a breakdown voltage within region A (which will vary as described above for each constant current device) that ranges from about −800 mV to about −2.0 V be applied to a constant current device such as devices 100 and 101 to reset or raise their constant current values, e.g., make more negative.

Although applying a more negative $V_2$ greater than −2.0 V typically results in the constant current device being destroyed, this is not always the case. This value e.g., −2.0 V, may vary depending upon the thickness of the layers within the constant current device. For instance, the thicker the device, a more negative $V_2$ may be applied e.g., more negative than −2.0 V without destroying the device. Further, applying a more negative $V_2$ greater than −2.0 V may result in the device resetting to a very low constant current value at which point the device can be pulsed and programmed as a constant current source again rather than destroying the device. Again, this is dependent on the thickness of the layers present in the constant current device. Thus, in one aspect, applying a more negative $V_2$ greater than −2.0 V can result in the device resetting to a low constant current value.

In effect, the methods disclosed above allow a constant current device's constant current level to be changed and reset. Changing or resetting the constant current value is non-destructive to the chalcogenide constant current device 100 or 101. Therefore, the constant current limit's value can be decreased, e.g., made more positive than the original constant current level of the constant current device by applying a $V_1$ voltage, and conversely, the constant current level can be reset or raised, e.g., made more negative than the original constant current value. It should be appreciated that the methods of the present invention are applicable to any constant current device and not limited to devices 100 and 101 constructed in accordance with FIGS. 1 and 2.

In another aspect, the invention also provides a method of utilizing a constant current device such that it functions as an analog memory device. This specific aspect provides a method of examining the constant current values which were applied to a constant current device. Once these constant current values are determined, the positive voltages, e.g., $V_1$, that were applied to achieve the constant current values can also be determined. In turn, these values can be read such that a memory state can correspond to each constant current value. Thus, when device 100 operates with different constant current values, the constant current device can be read such that a plurality of memory states can be stored. Each memory state corresponds to a specific constant current value. For instance, repeated current pulses of similar or less amplitude can further increase or decrease the constant current's amplitude. Each of these values can be read and stored for an analog assortment of varying states.

Figure 8:
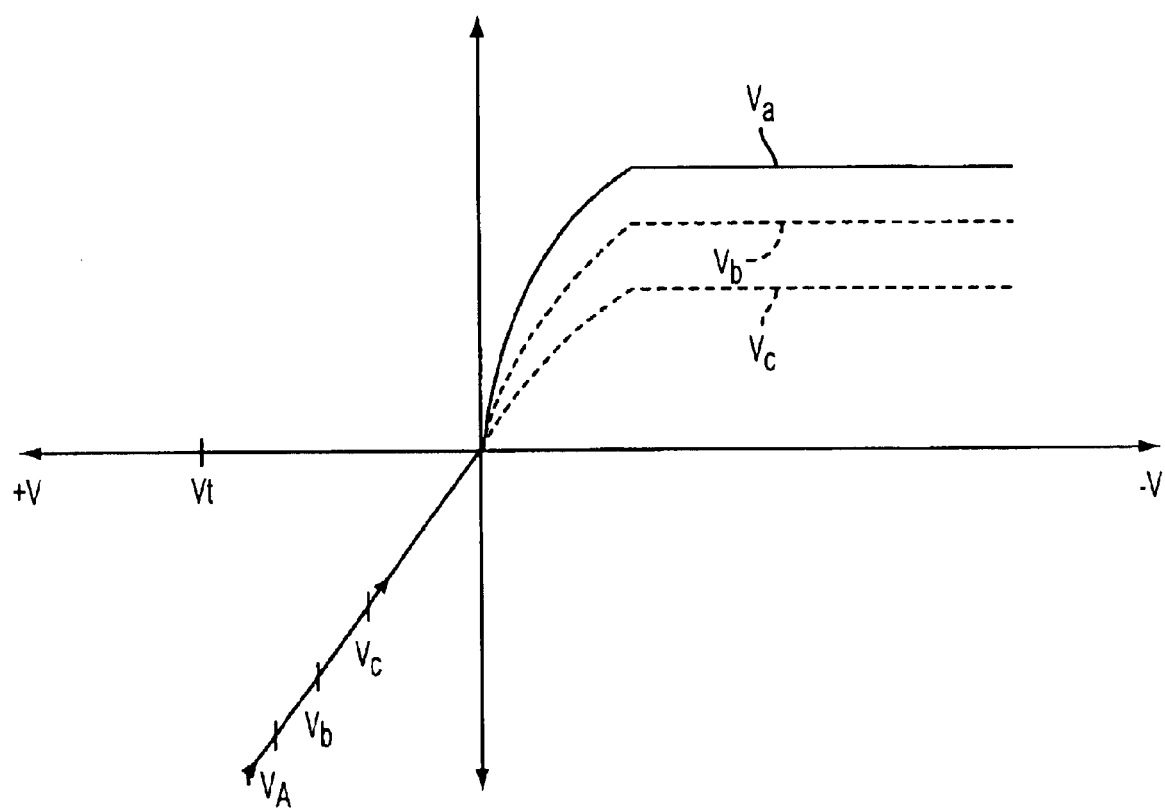
FIG. 8 is a graph illustrating the original positive voltages applied to a chalcogenide constant current device and the resulting constant current I–V characteristics.

FIG. 8 illustrates the method for reading the constant current values of a constant current device such that it functions as an analog memory device. For example, when there are three available constant current values such as 0.1 μA, 0.5 μA, and 1 μA, one of the three different signal levels can be stored and read by measuring the current value. As described above in FIGS. 4 and 5, the same constant current device can possess different constant current values. Applying a positive voltage ($V_1$), as FIG. 4 illustrates, to the constant current device decreases the value of the constant current limit, e.g., makes the constant current amplitude decrease, as FIG. 5 illustrates. Applying a positive voltage such as lines 60, 70, and 80 of FIG. 4 can result in lines 61, 71, and 81 of FIG. 5. At least one of these constant current values can be stored and read individually. As noted previously, a plurality of constant current values can be achieved in a single constant current device.

FIG. 8 graphically illustrates $V_a$, $V_b$, and $V_c$. Depending upon the values of $V_a$, $V_b$, and $V_c$, the positive voltage which was applied to achieve $V_a$, $V_b$, and $V_c$ can be determined. For instance, the constant current value $V_a$ allows the calculation of the positive $V_1$ that was applied to cause $V_a$. Similarly, utilizing the constant current values of $V_b$ and $V_c$ allows die calculation of the positive $V_1$ that was applied to cause $V_b$ and $V_c$. Each corresponding constant current value, $V_a$, $V_b$, and $V_c$ for instance, can then be stored as a separate memory state for the device.

It should he appreciated that although the methods of the present invention described above refer to a chalcogenide constant current structure 100, the methods of the invention are equally applicable to any constant current structure, such as constant current structure 101, and are not just limited to the constant current structures disclosed within.

Further, although the embodiments described above refer to the formation of only one chalcogenide constant current structure 100 or 101, it must be understood that the invention contemplates the formation of any number of such chalcogenide constant current structures. A plurality of chalcogenide constant current structures can be fabricated and provided and operated with a plurality of elements as a non-limiting example. Thus, the chalcogenide glass constant current structure 100 or 101 can be utilized in many electronic devices. Specifically, the methods and operation of the structures disclosed above, can be used in any device whenever it is desired to have a constant current maintaining device that maintains a constant current over a wide range of applied voltages.

Figure 9:
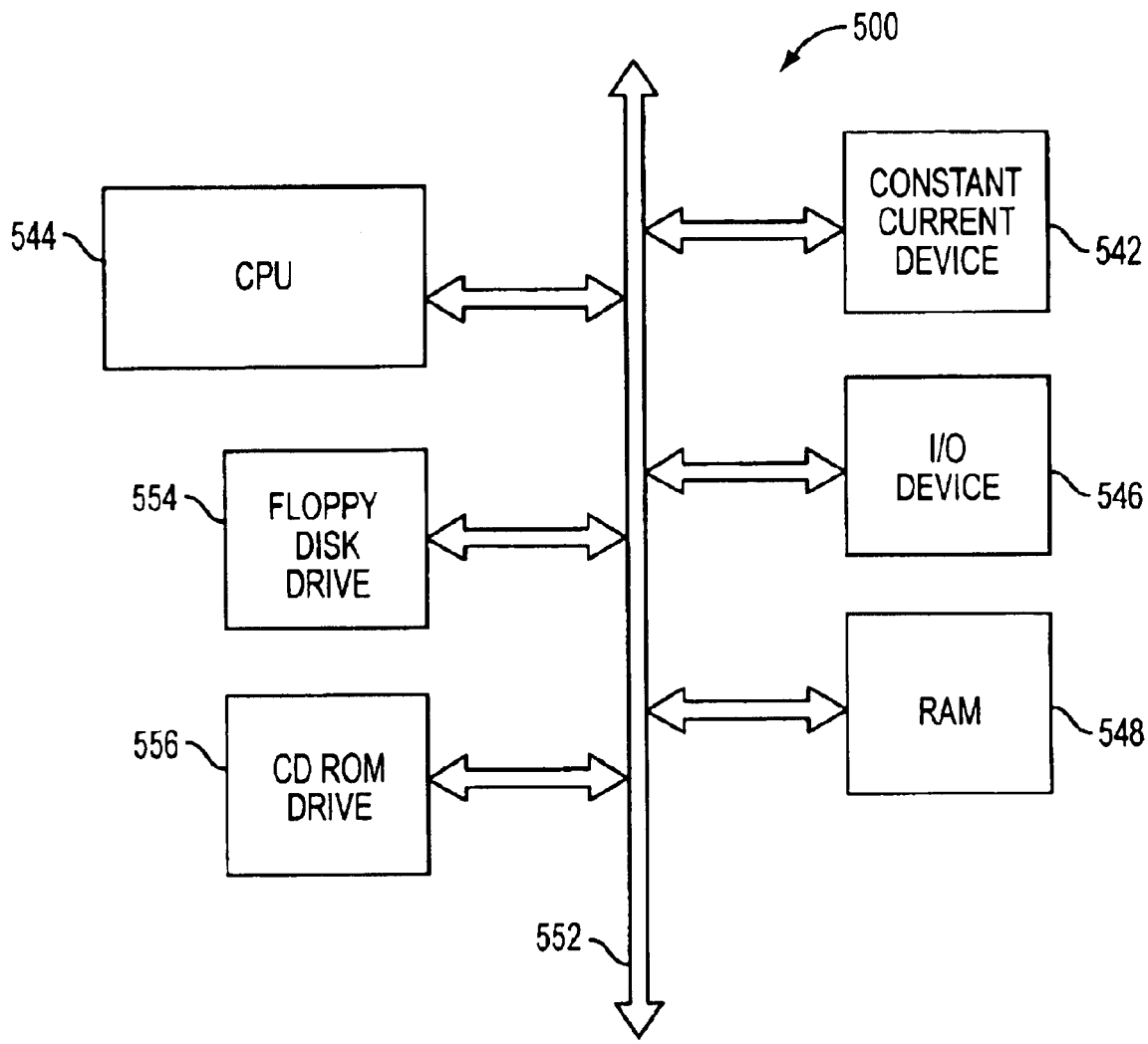
FIG. 9 illustrates a computer system incorporating a chalcogenide constant current device formed in accordance with the invention.

A typical processor based system which includes a constant current device according to the present invention is illustrated generally at 500 in FIG. 9. A processor based system is exemplary of a system having digital circuits which could include constant current devices. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 544, for example, a microprocessor, that communicates with an input/output (I/O) device 546 over a bus 552. The constant current device 542 also communicates with the system over bus 552. The computer system 500 also includes random access memory (RAM) 548, and, in the case of a computer system may include peripheral devices such as a floppy disk drive 554 and a compact disk (CD) ROM drive 556 which also communicate with CPU 544 over the bus 552. Constant current device 542 is preferably constructed as an integrated circuit containing at least one chalcogenide glass layer and a metal-containing layer, as previously described with respect to FIGS. 1–8. It may also be desirable to integrate the processor 554, constant current device 542 and memory 548 on a single IC chip.

The invention is not limited to the details of the illustrated embodiments. Accordingly, the above description and drawings are only to be considered illustrative of exemplary embodiments which achieve the features and advantages of the invention. Modifications and substitutions to specific methods, process conditions, and structures can be made without departing from the spirit and scope of the invention. Accordingly, the invention is not to be considered as being limited by the foregoing description and drawings, but is only limited by the scope of the appended claims.

What is claimed is:

1. A constant current device comprising:
   at least one chalcogenide glass layer; and,
   at least one metal-containing layer, said device being set to operate in a constant current mode by an applied first voltage across said layers to provide a substantially constant current over an applied voltage range.

2. The structure as in claim 1, wherein said at least one chalcogenide glass layer is a $Ge_xSe_{100-x}$ layer having a stoichiometry from about $Ge_{18}Se_{82}$ to about $Ge_{43}Se_{57}$.

3. The structure as in claim 2, wherein said at least one chalcogenide glass layer has a stoichiometry of about $Ge_{40}Se_{60}$.

4. The structure as in claim 1, wherein said at least one chalcogenide glass layer is about 150 Å to about 400 Å thick.

5. The structure as in claim 4, wherein said at least one chalcogenide glass layer is about 250 Å thick.

6. The structure as in claim 1, wherein said device further comprises a second chalcogenide glass layer provided on said metal-containing layer, said second chalcogenide glass layer is about 50 Å to about 500 Å thick.

7. The structure as in claim 6, wherein said second chalcogenide glass layer is about 150 Å thick.

8. The structure as in claim 1, wherein said metal-containing layer is a silver-selenide layer.

9. The structure as in claim 1, wherein said metal-containing layer is a chalcogenide layer containing Ag.

10. The structure as in claim 9, wherein said chalcogenide layer is selected from the group consisting of O, S, Se, Te, and Po.

11. The structure as in claim 1, wherein said metal-containing layer is about 200 Å to about 2000 Å thick.

12. The structure as in claim 11, wherein said metal-containing layer is about 600 Å thick.

13. The structure as in claim 1, wherein said applied first voltage is a significantly more negative pulse than an erase potential of said device.

14. The structure as in claim 13, wherein said negative pulse is applied within the range from about −800 mV to about −2.0 V.

15. The structure as in claim 14, wherein said negative pulse is applied within a pulse duration range of about 8 ns to about 30 ns.

16. The structure as in claim 1, wherein said device maintains a constant current over an applied voltage range of at least 700 mV.

17. The structure as in claim 1, wherein said device further comprises at least one electrode and a voltage source.

18. A constant current service device comprising:
   a first and second chalcogenide glass layer; and,
   a metal-containing layer provided between said first and second chalcogenide glass layers, said layers having a stoichiometry and thickness such that an applied negative pulse across said layers greater than an erase potential of the device causes said device to operate in constant current mode.

19. The device as in claim 18, wherein said first and second chalcogenide glass layers is a $Ge_xSe_{100-x}$ layer having a stoichiometry from about $Ge_{18}Se_{82}$ to about $Ge_{43}Se_{57}$.

20. The device as in claim 19, wherein said chalcogenide glass layers have a stoichiometry of about $Ge_{40}Se_{60}$.

21. The device as in claim 18, wherein said first chalcogenide glass layer is about 150 Å to about 400 Å thick.

22. The device as in claim 21, wherein said first chalcogenide glass layer is about 250 Å thick.

23. The device as in claim 18, wherein said second chalcogenide glass layer is about 50 Å to about 500 Å thick.

24. The device as in claim 23, wherein said second chalcogenide glass layer is about 150 Å thick.

25. The device as in claim 18, wherein said metal-containing layer is a silver-selenide layer.

26. The device as in claim 18, wherein said metal-containing layer is a chalcogenide layer containing Ag.

27. The device as in claim 26, wherein said chalcogenide layer is selected from the group consisting of O, S, Se, Te, and Po.

28. The device as in claim 18, wherein said metal-containing layer is about 200 Å to about 2000 Å thick.

29. The device as in claim 28, wherein said metal-containing layer is about 600 Å thick.

30. The device as in claim 18, wherein said negative pulse is applied within the range from about −800 mV to about −2.0 V.

31. The device as in claim 30, wherein said negative pulse is applied within a pulse duration range of about 8 ns to about 30 ns.

32. The device as in claim 18, wherein said device maintains a constant current over an applied voltage range of at least 700 mV.

33. The device as in claim 18, further comprising at least one electrode and a voltage source.

34. A current device comprising:
a first conductive layer;
a chalcogenide glass layer provided over said first conductive layer;
a metal-containing layer provided over said chalcogenide glass layer;
a second conductive layer provided over said metal-containing layer; and,
a negative pulse of a predetermined magnitude is applied across said second and first conductive layers to cause said device to operate in constant current mode.

35. The device as in claim 34, wherein said chalcogenide glass layer is a $Ge_xSe_{100-x}$ layer having a stoichiometry from about $Ge_{18}Se_{82}$ to about $Ge_{43}Se_{57}$.

36. The device as in claim 35, wherein said chalcogenide glass layer has a stoichiometry of about $Ge_{40}Se_{60}$.

37. The device as in claim 34, wherein said chalcogenide glass layer is about 150 Å to about 400 Å thick.

38. The device as in claim 37, wherein said chalcogenide glass layer is about 250 Å thick.

39. The device as in claim 34, wherein said metal-containing layer is a silver-selenide layer.

40. The device as in claim 34, wherein said metal-containing layer is a chalcogenide layer containing Ag.

41. The device as in claim 39, wherein said chalcogenide layer is selected from the group consisting of O, S, Se, Te, and Po.

42. The device as in claim 34, wherein said metal-containing layer is about 200 Å to about 2000 Å thick.

43. The device as in claim 42, wherein said metal-containing layer is about 600 Å thick.

44. The device as in claim 34, wherein said first and second conductive layers comprise a conductive material such as, one or more of tungsten, nickel, tantalum, tantalum nitride, copper, aluminum, platinum, silver, or titanium nitride.

45. The device as in claim 34, wherein said negative pulse is applied within the range from about −800 mV to about −2.0 V.

46. The device as in claim 45, wherein said negative pulse is applied within a pulse duration range of about 8 ns to about 30 ns.

47. The device as in claim 34, further comprising a second chalcogenide glass layer provided on said metal-containing layer.

48. The device as in claim 47, wherein said second chalcogenide glass layer is a $Ge_xSe_{100-x}$ layer having a stoichiometry from about $Ge_{18}Se_{82}$ to about $Ge_{43}Se_{57}$.

49. The device as in claim 48, wherein said second chalcogenide glass layer has a stoichiometry of about $Ge_{40}Se_{60}$.

50. The device as in claim 47, wherein said second chalcogenide glass layer is about 50 Å to about 500 Å thick.

51. The device as in claim 50, wherein said second chalcogenide glass layer is about 150 Å thick.

52. The device as in claim 49, wherein said second chalcogenide glass layer is provided in between said metal-containing layer and said second conductive layer.

53. The device as in claim 34, wherein said device maintains a constant current over an applied voltage range of at least 700 mV.

54. The device as in claim 34, further comprising a voltage source that applies said negative pulse to said layers.

55. A constant current maintaining structure comprising:
at least two germanium-selenide glass layers having a stoichiometry from about $Ge_{18}Se_{82}$ to about $Ge_{43}Se_{57}$, wherein at least one germanium-selenide glass layer is approximately equal to or greater than 50 Å thick;
at least one metal-containing layer provided between said at least two germanium-selenide layers;
two electrodes
a layer comprising silver provided between said two electrodes; and,
a negative pulse of at least −800 mV or greater in magnitude is applied across said two electrodes causing said device to operate as a constant current device.

56. The structure as in claim 55, wherein said at least two germanium-selenide glass layers have a stoichiometry of about $Ge_{40}Se_{60}$.

57. The structure as in claim 55, wherein said at least two germanium-selenide glass layers are about less than 500 Å thick.

58. The structure as in claim 55, wherein said metal-containing layer is a silver-selenide layer.

59. The structure as in claim 55, wherein said metal-containing layer is a chalcogenide layer containing Ag.

60. The structure as in claim 59, wherein said chalcogenide layer is selected from the group consisting of O, S, Se, Te, and Po.

61. The structure as in claim 55, wherein said metal-containing layer is about 200 Å to about 2000 Å thick.

62. The structure as in claim 55, wherein said metal-containing layer is about 600 Å thick.

63. The structure as in claim 55, wherein said two electrodes comprises a conductive material selected from a group such as, one or more of tungsten, nickel, tantalum, tantalum nitride, copper, aluminum, platinum, silver, or titanium nitride.

64. The structure as in claim 55, wherein said at least one germanium-selenide glass layer is about 150 Å to about 400 Å thick.

65. The structure as in claim 55, wherein said device maintains a constant current over an applied voltage range of at least 700 mV.

66. The structure as in claim 55, wherein said silver layer is approximately about 500 Å thick or less.

67. The structure as in claim 66, wherein said silver layer is approximately 200 Å thick.

68. The structure as in claim 55, further comprising a voltage source that applies said negative pulse to said electrodes.

69. A processor-based system, comprising:
a processor; and,
a memory circuit connected to said processor, at least one of said processor and said memory circuit including a constant current device comprising:
at least one chalcogenide glass layer; and,
at least one metal-containing layer, said device being set to operate in a constant current mode by an applied first voltage across said layers to provide a substantially constant current over an applied voltage range.

70. The system as in claim 69, wherein said at least one chalcogenide glass layer is a $Ge_xSe_{100-x}$ layer having a stoichiometry from about $Ge_{18}Se_{82}$ to about $Ge_{43}Se_{57}$.

71. The system as in claim 70, wherein said at least one chalcogenide glass layer has a stoichiometry of about $Ge_{40}Se_{60}$.

72. The system as in claim 69, wherein said at least one chalcogenide glass layer is about 150 Å to about 400 Å thick.

73. The system as in claim 72, wherein said at least one chalcogenide glass layer is about 250 Å thick.

74. The system as in claim 69, wherein a second chalcogenide glass layer is provided on said metal-containing layer, said second chalcogenide glass layer is about 50 Å to about 500 Å thick.

75. The system as in claim 74, wherein said second chalcogenide glass layer is about 150 Å thick.

76. The system as in claim 69, wherein said metal-containing layer is a silver-selenide layer.

77. The system as in claim 69, wherein said metal-containing layer is a chalcogenide layer containing Ag.

78. The system as in claim 77, wherein said chalcogenide layer is selected from the group consisting of O, S, Se, Te, and Po.

79. The system as in claim 69, wherein said metal-containing layer is about 200 Å to about 2000 Å thick.

80. The system as in claim 79, wherein said metal-containing layer is about 600 Å thick.

81. The system as in claim 69, wherein said applied first voltage is a more negative pulse greater than an erase potential of said device.

82. The system as in claim 81, wherein said negative pulse is applied within the range from about −800 mV to about −2.0 V.

83. The system as in claim 82, wherein said negative pulse is applied within a pulse duration range of about 8 ns to about 30 ns.

84. The system as in claim 69, wherein said device maintains a constant current over an applied voltage range of at least 700 mV.

85. The system as in claim 69, further comprising at least one electrode and a voltage source.

* * * * *

UNITED STATES PATENT AND TRADEMARK OFFICE
CERTIFICATE OF CORRECTION

| PATENT NO. | : 6,813,178 B2 |
|---|---|
| APPLICATION NO. | : 10/386028 |
| DATED | : November 2, 2004 |
| INVENTOR(S) | : Kristy A. Campbell et al. |

It is certified that error appears in the above-identified patent and that said Letters Patent is hereby corrected as shown below:

Title Page #56
In the References Cited "Other Publications":

Insert:--Miyatani, S.-y., Electrical properties of Ag2Se, J. Phys. Soc. Japan 13 (1958) 317.--

The following items have typographical errors which should be corrected.

Page 1: Yoji Kawamoto, et al., "Ionic Conduction in $As_2$-$S_3$-$Ag_2$S, and $P_2S_5$-$Ag_2$S Glasses," Journal of Non-Crystalline Solids 20, pp. 393-404 (1976).  Title should read --"Ionic Conduction in $As_2$-$S_3$-$Ag_2$S, $GeS_2GeS$-$Ag_2$S and $P_2S5$-$Ag_2$S Glasses,"--;

Page 3: Asahare, Y.; Izumitami, T., Voltage controlled switching in Cu-AS-Se compositions, J. Non-Cryst. Solids 11 (1972) 97-104.   "Asahare" should read --Asahara--.

Page 3: Asokan, S.; Prasad, M.V.N.; Parthasarathy, G.; Gopai, E.S.R., Mechanical and chemical thresholds in IV-VI chalcogenide glasses, Phys. Rev. Lett 62 (1989) 808-810.     "Gopai," should read --Gopal,--;

Page 3: Boolchand, P. The maximum in glass transition temp ature (Tg) near x=1/3 in GexSe1-x Glasses, Asian Journal of Physics (2000) 9, 709-72.
"temp rature" should read --temperature--;

Title page 4: El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.  --El-kady, Y.L., The threshold switching in semiconducting glass Ge21Se17Te62, Indian J Phys. 70A (1996) 507-516.-- Highlighted reference should be listed separately.

Title page 4: Guin, J.-P.;Rouxel, T.; Sangleboeuf, J.—C.: Meiscoet, L.; Lucas, J., Hardness, toughness and scratchability of germanium-selenium chalco nid glasses, J. Am. Ceram. Soc. 85 (2002) 1545-52.   "chalco nid" should read --chalcogenide--;

Title page 5: Hajto, J.;McAuley, B.; Snell, A.J.; Owen, A.E., Theory of room temperature quantized resistance effects in meal-a-Si:H-metal thin film structures, J. Non-Cryst. Solids 198-200 (1996) 825-828.   "meal" should read --metal--;

UNITED STATES PATENT AND TRADEMARK OFFICE
CERTIFICATE OF CORRECTION

PATENT NO. : 6,813,178 B2
APPLICATION NO. : 10/386028
DATED : November 2, 2004
INVENTOR(S) : Kristy A. Campbell et al.

Page 2 of 3

It is certified that error appears in the above-identified patent and that said Letters Patent is hereby corrected as shown below:

Title page 5: Kawaguchi, T.; Masui, K., Analysis of change in optical transmission sp ctra resulting from Ag photodoping in chalcogenide film, Japn. J. Appl. Phys. 26 (1987) 15-21. "sp ctra" should read --spectra--;

Title page 5: Lakshiminarayan, K.N.; Srivastava, K.K.; Panwar, O.S.; Dumar, A., Amorphous semiconductor devices: memory switching and mechanism, J. Instn Electronics & Telecom. Engrs 27 (1981) 16-19. "switching and" should read --and switching--;

Title Page On page 6: Nang, T.T.; Okuda, M.; Matsushsita, T.; Yokota, S.; Suzuki, A., Electrical and optical parameters of G xSe1-x amorphous thin films, Jap. J. App. Phys. 15 (1976) 849-853. "G xSe1-x" should read --GexSe1-x--;

Title Page On page 6: Narayanan, R.A.; Asokan, S.; Kumar, A., Evidence conc rning th affect of topology on electrical switching in chalcogenide network glasses, Phys. Rev. B 54 (1996) 4413-4415. "conc rning th affect" should read --concerning the effect--;

Title Page On page 6: Rose, M.J.; Snell, A.J.; Lecomber, P.G.; Hajto, J.; Fitzgerald, A.G.; Owen, A.E., Aspects on non-volatility in a -Si:H memory device, Mat. Res. Soc. Symp. Proc. V 258, 1992, 1075-1980. "on" should read --of-- and "1075-1980." should read --1075-1080.--;

Title Page page 6: St v nton, A.G., The switching mechanisms in amorphous chalcogenide memory devices, J. Non-Cryst. Solids 21 (1976) 319-329. "St v nton, A." should read --Steventon, A.--;

Title page 6: Stocker, H.J., Bulk and thin film switching and m mory effects in semiconducting chalcogenide glasses, App. Phys. Lett. 15 (1969) 55-57. "m mory" should read --memory--;

Title page 7: Weirahcu, D.F., Threshold switching and thermal filaments in amorphous semiconductors, App. Phys. Lett. 16 (1970) 72-73. "Weirahcu" should read --Weirauch--;

On page 7, McHardy et al., The dissolution of metals in amorphous chalcogenides and the effects o electron and ultraviolet radiation, 20 J. PHYS. C.: SOLID STATE PHYS., pp. 4055-4075 (1987)f. "o" should read --of-- and "(1987)f." should read --(1987).--.

UNITED STATES PATENT AND TRADEMARK OFFICE
CERTIFICATE OF CORRECTION

PATENT NO. : 6,813,178 B2
APPLICATION NO. : 10/386028
DATED : November 2, 2004
INVENTOR(S) : Kristy A. Campbell et al.

It is certified that error appears in the above-identified patent and that said Letters Patent is hereby corrected as shown below:

In the Specification:

Column 7, line 53, "device exhibit" should read --device to exhibit--;

Column 13, line 48, "raises die" should read --raises the--.

In the Claims:

Claim 18: Column 16, line 56, "service" should read --source--.

Signed and Sealed this

Twenty-fourth Day of October, 2006

JON W. DUDAS
*Director of the United States Patent and Trademark Office*